US009763325B2

(12) United States Patent
Chang et al.

(10) Patent No.: US 9,763,325 B2
(45) Date of Patent: Sep. 12, 2017

(54) MICROREACTOR-ASSISTED PRINTING OF CONDUCTIVE TRACES WITH IN-SITU REACTIVE INKS

(71) Applicant: Oregon State University, Corvallis, OR (US)

(72) Inventors: Chih-Hung Chang, Corvallis, OR (US); Chang-Ho Choi, Corvallis, OR (US)

(73) Assignee: Oregon State University, Corvallis, OR (US)

( * ) Notice: Subject to any disclaimer, the term of this patent is extended or adjusted under 35 U.S.C. 154(b) by 0 days.

(21) Appl. No.: 15/093,551

(22) Filed: Apr. 7, 2016

(65) Prior Publication Data

US 2016/0302305 A1    Oct. 13, 2016

Related U.S. Application Data

(60) Provisional application No. 62/144,297, filed on Apr. 7, 2015.

(51) Int. Cl.
| | |
|---|---|
| H05K 1/00 | (2006.01) |
| H05K 1/09 | (2006.01) |
| H01L 31/02 | (2006.01) |
| H05K 3/12 | (2006.01) |
| H05K 1/03 | (2006.01) |

(52) U.S. Cl.
CPC ....... *H05K 1/097* (2013.01); *H01L 31/02008* (2013.01); *H05K 3/1241* (2013.01); *H05K 1/0393* (2013.01); *H05K 2203/0786* (2013.01); *H05K 2203/1157* (2013.01)

(58) Field of Classification Search
CPC .......... H05K 1/97; H05K 1/346; H05K 1/393; H05K 3/12; H05K 3/85; H01L 21/00; H01L 31/00; H01L 31/2008; B29B 9/00; C08G 63/00
USPC .............. 174/253; 435/183; 264/9; 204/601, 204/643; 422/200, 224; 1/1
See application file for complete search history.

(56) References Cited

U.S. PATENT DOCUMENTS

| | | | | |
|---|---|---|---|---|
| 8,553,333 B2* | 10/2013 | Chang | .................. | B01F 5/0256 359/619 |
| 8,753,515 B2* | 6/2014 | Curtis | .................... | A61M 1/16 210/646 |
| 8,801,979 B2* | 8/2014 | Chang | .................. | B01J 19/0093 264/11 |
| 9,073,018 B2* | 7/2015 | Ishiyama | .............. | B01F 5/0256 |
| 9,283,560 B2* | 3/2016 | Dothie | ............... | G01N 15/1404 |
| 2005/0006339 A1* | 1/2005 | Mardilovich | ....... | C23C 18/1601 216/39 |

(Continued)

*Primary Examiner* — Xiaoliang Chen
(74) *Attorney, Agent, or Firm* — Green, Howard & Mughal LLP

(57) ABSTRACT

Highly conductive silver may be fabricated at room temperature using in-situ reactive silver precursor inks by microreactor-assisted printing without any post-processing. Reactive silver nanoinks, synthesized in-situ from the microreactor, may be directly delivered onto glass and polymeric substrates without any surface treatment to form a highly dense and uniform silver feature. The distribution of the reactive silver nanoinks can be controlled by adjusting the flow rate of the continuous flow. Silver lines may be fabricated using the in-situ reactive precursors delivered via a micro-channel applicator.

11 Claims, 10 Drawing Sheets

(56) References Cited

U.S. PATENT DOCUMENTS

| | | | | |
|---|---|---|---|---|
| 2007/0099330 A1* | 5/2007 | Kodas | ............... | C23C 18/06 |
| | | | | 438/64 |
| 2008/0108122 A1* | 5/2008 | Paul | ............... | B01F 5/0475 |
| | | | | 435/183 |
| 2011/0025338 A1* | 2/2011 | Willey | ............. | G01N 27/42 |
| | | | | 324/439 |
| 2012/0001356 A1* | 1/2012 | Chang | ............ | B01J 19/0093 |
| | | | | 264/9 |
| 2012/0298037 A1* | 11/2012 | Paul | ............... | B01F 5/0475 |
| | | | | 118/712 |
| 2014/0134503 A1* | 5/2014 | Lockett | .......... | H01G 11/36 |
| | | | | 429/401 |

\* cited by examiner

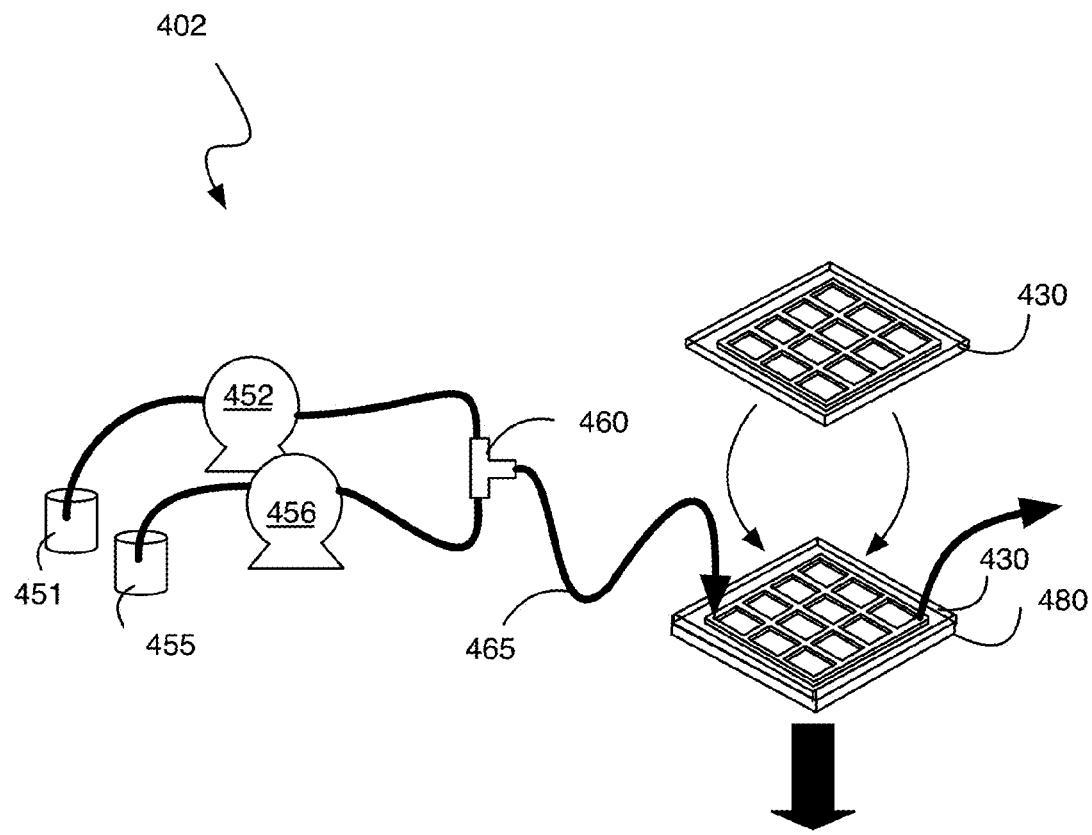
FIG. 4C
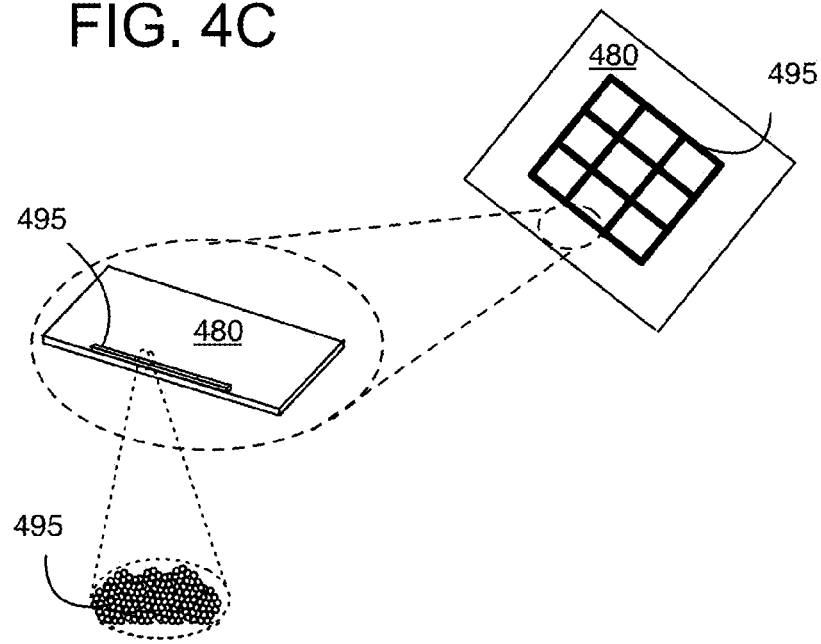

MICROREACTOR-ASSISTED PRINTING OF CONDUCTIVE TRACES WITH IN-SITU REACTIVE INKS

GOVERNMENT LICENSE RIGHTS

This invention was made with government support under Grant No. IIP 1439485 awarded by NSF I-Corps. The government has certain rights in the invention.

CROSS-REFERENCE TO RELATED APPLICATIONS

This application is a non-provisional application of U.S. provisional application No. 62/144,297, filed on Apr. 7, 2015, the subject matter of which is incorporated herein by reference in its entirety for all purposes.

BACKGROUND

Silver possesses excellent electrical conductivity, surface plasmon resonance (SPR), and high reflectivity, leading to a variety of applications such as microelectronic circuitry, gas sensors, low emissivity coating and more recently as transparent conductive electrodes for displays. Since the properties of silver features are closely associated with synthetic approaches, many different synthetic methods have been developed to yield high quality silver features. Direct printing in an atmospheric environment offers a potentially low-cost and materials-efficient method for manufacturing silver features for electronics and energy devices. Significant efforts and progress have been made in developing printable silver inks. Nanoparticle suspension and organometallic compounds are the two primary precursors. Many research groups have reported highly conductive silver features using silver nanoparticle inks after annealing at approximately 200-350° C. Omnidirectional printing of remarkable silver features using colloidal silver nanocrystal inks has been reported. For the ink preparation, organic stabilizers were needed to create a stable silver nanoparticle suspension. A post-sintering process is required after the printing to remove organic stabilizers that usually decompose at temperatures larger than 200° C. Enormous efforts have been made to further reduce the sintering temperature by developing novel silver precursor inks. Use of two inks channels to implement silver mirror reaction has also been reported. The electrical conductivity of the resulting silver lines is 6% of bulk silver at room temperature. Use of microwave flash sintering to shorten the sintering duration of printed silver nanocrystals has been reported. Argon plasma sintering to fabricate the silver film on a plastic substrate at a substrate temperature of 120° C. has been reported. Self-sintered silver nanoparticles after a short exposure to HCl vapors was reported to achieve the high electrical conductive path at room temperature. The sintering of inkjet printed silver tracks with boiling salt water has been reported. Silver with good conductivity could has reportedly been obtained at a relatively low temperature of 150° C. using organo-silver ink. Most recently, reactive particle-free silver inks have been reported by modifying the Tollens' agent. Silver features with high conductivity were obtained after 100° C. heat treatment. These innovative approaches are capable of producing highly conductive silver features at relatively low temperatures. However, there are still areas for improvement. The synthesis of well-dispersed silver nanoparticle and organic metallic inks suitable for printing and low temperature sintering usually requires the stringent selection of reactants for the synthesis, sufficient stability to ensure ink shelf-life, and tedious synthesis procedures that increased the cost. In addition, the sintering processes require additional power sources and facilities.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIG. 4C is a schematic diagram of a system to manufacture a transparent conductive silver grid, in accordance with some embodiments;

DETAILED DESCRIPTION OF EXEMPLARY EMBODIMENTS

Figure 1A:
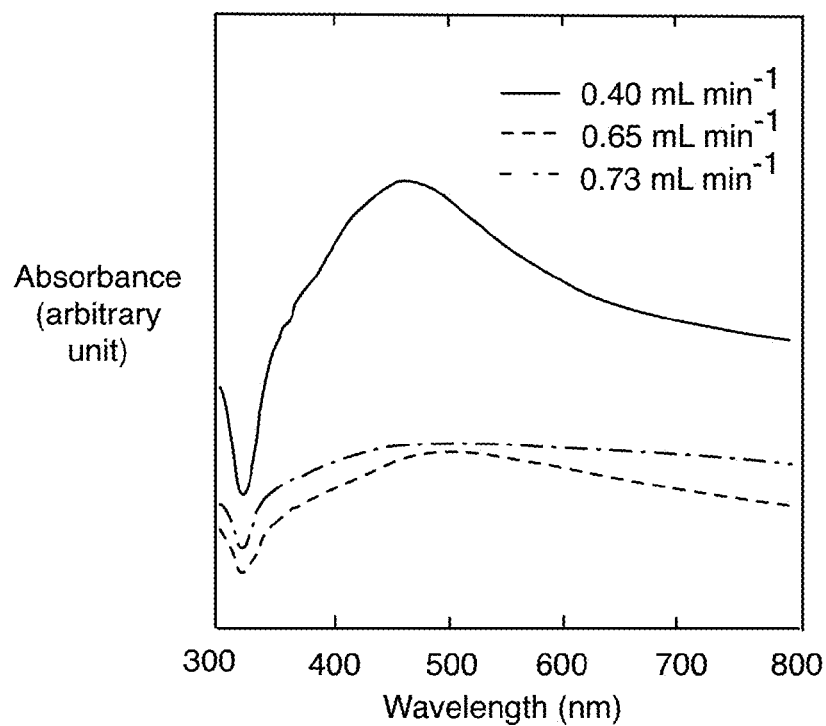
FIG. 1A illustrates a real time analysis of optical properties of silver inks at various flow rates through a micromixer, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

As further described below, conductive films and/or traces are fabricated with micro-reactor assisting printing of in-situ conductive inks. In some embodiments, continuous fluid chemical deposition described herein may utilize one or more micromixers and microchannel devices, for example based on those disclosed in U.S. Pat. No. 7,507,380, and/or International Publication WO2010085764, both of which are incorporated herein by reference in their entirety for all purposes.

Some embodiments include the fabrication of highly conductive silver features at room temperature using in-situ reactive precursor inks generated by a novel microreactor-assisted printing technique without any post processing steps. A Tollens' process offers some advantages of preparing silver film, including the simplicity, low cost, and low temperature. Particularly the Tollens' process allows for the silver film formation in the absence of organic stabilizers. However, the typical Tollens' reaction is based on the batch process, resulting in some inherent problems such as the homogeneous particle formation, difficulty in reaction selectivity that consequently resulted in non-uniform film formation. Embodiments herein employ a continuous-flow microreactor-assisted process to control a modified Tollen's reaction to generate in-situ silver precursor inks to resolve some of these issues. In a continuous flow microreactor, reaction kinetics can be controlled by simply adjusting process parameters. For example, by properly tuning the flow rate of solution, which in turn controls the residence time, we were able to obtain various reactive precursors such as reactive molecular species, individual nanocrystals, or assembly of nanocrystals. These reactive precursors are then delivered immediately onto a surface to enable surface reaction and/or assembly. In some embodiments, the modified Tollens' reagent is prepared by dissolving silver nitrate ($AgNO_3$) into deionized water containing ammonium hydroxide ($NH_4OH$).

Figure 1B:
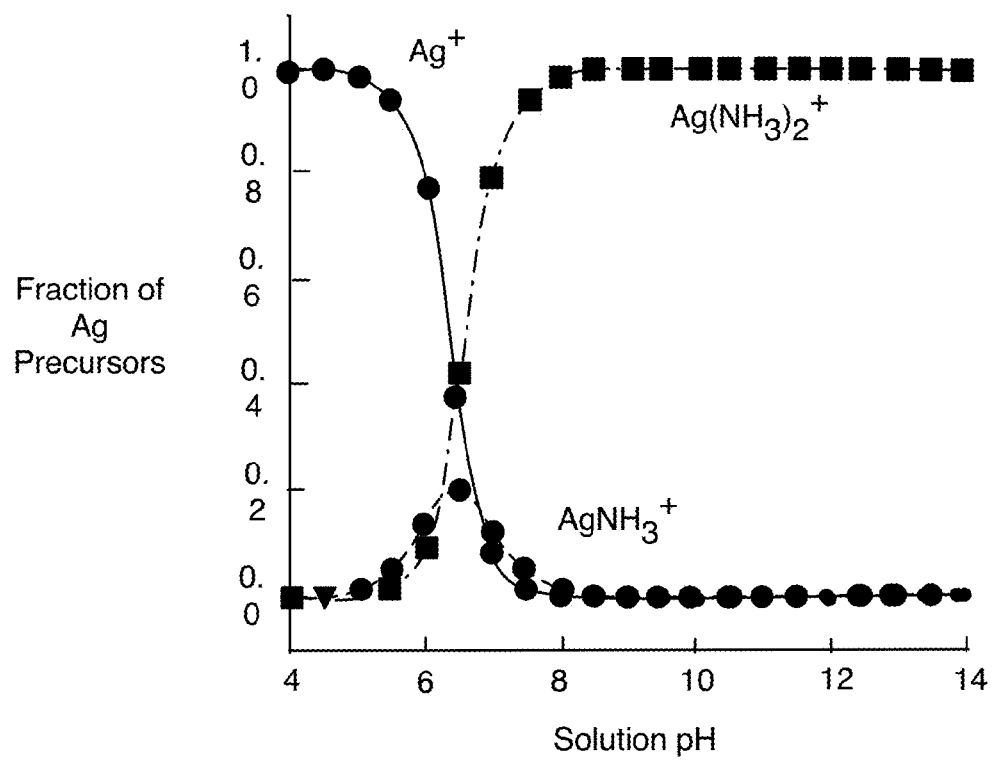
FIG. 1B is a speciation diagram of silver precursors as a function of solution pH, in accordance with some embodiments.

FIG. 1A illustrates a real time analysis of optical properties of silver inks at various flow rates through a micromixer, in accordance with some embodiments. The speciation diagram in FIG. 1B illustrates the pH range where the high purity of the Tollens' reagent ($Ag(NH_3)_2^+$) is generated. The pH range from 9 to 12 was found to be appropriate for $Ag(NH_3)_2^+$ formation according to the speciation diagram. The solution acidity for this exemplary embodiments was measured to be around a pH value of 11 which is within the pH range to purely generate the $Ag(NH_3)_2^+$. Formaldehyde may be employed as a reductant. Reactive silver precursor inks may be generated in-situ as the Tollens' reagent, the $Ag(NH_3)_2^+$ solution, is mixed with the formaldehyde solution via a micromixer. The silver mirror reaction takes place following the reaction:

$$HCHO + 2[Ag(NH_3)^2]^+ + 2OH^- \rightarrow HCOONH_4 + 2Ag + 3NH_3 + H_2O. \qquad (Eq. 1)$$

Absorbance analysis was performed in real time using UV-Vis absorption measurement (Ocean Optics Inc.) to investigate the kinetics of silver precursor ink formation. The UV-Vis absorption spectra at different mean residence time controlled by the flow rate are given in FIG. 1A. For example, the flow rate of 0.65 mL min$^{-1}$ and 0.73 mL min$^{-1}$ correspond to a residence time of 74 seconds and 65 seconds respectively. It can be seen clearly from the spectra that an absorption peak between 400 and 450 nm is growing at longer residence time. This absorption is associated with the surface plasmon of silver nanocrystals. This result is consistent with the silver mirror reaction starting from the generation of silver atoms, following by the formation of small nuclei then subsequently leading to silver nanocrystals.

Figure 2A:
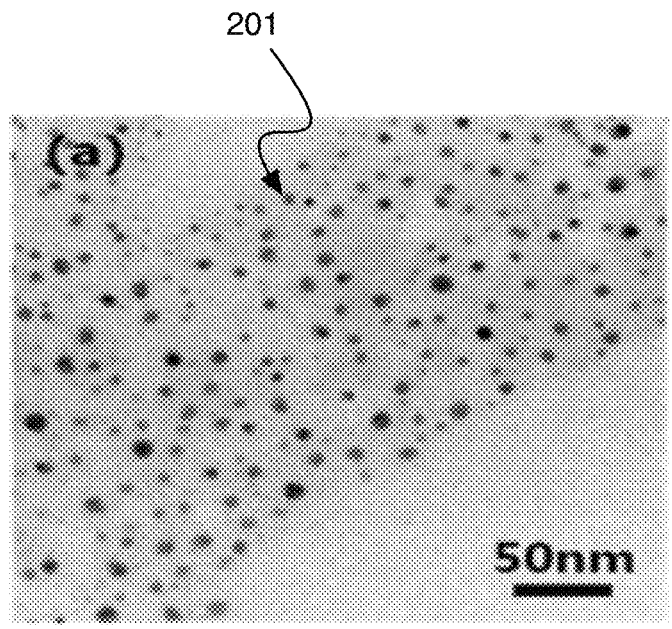
FIG. 2A is a transmission electron micrograph (TEM) image of silver nanocrystals, in accordance with some embodiments.
Figure 2B:
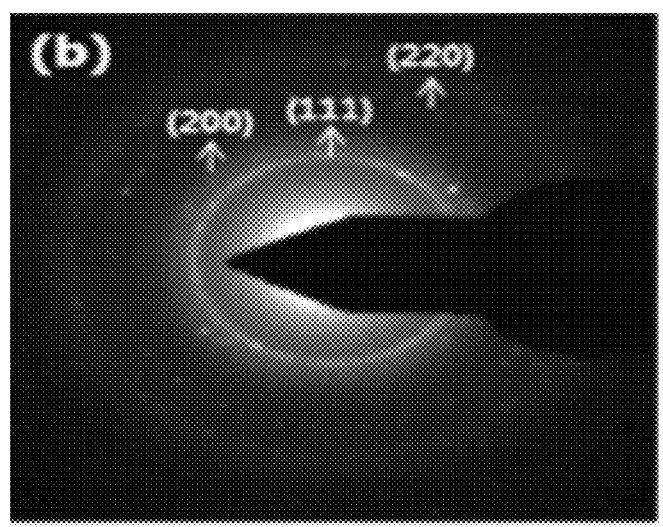
FIG. 2B is a selected area electron diffraction (SAED) pattern of silver nanocrystals, in accordance with some embodiments.
Figure 2C:
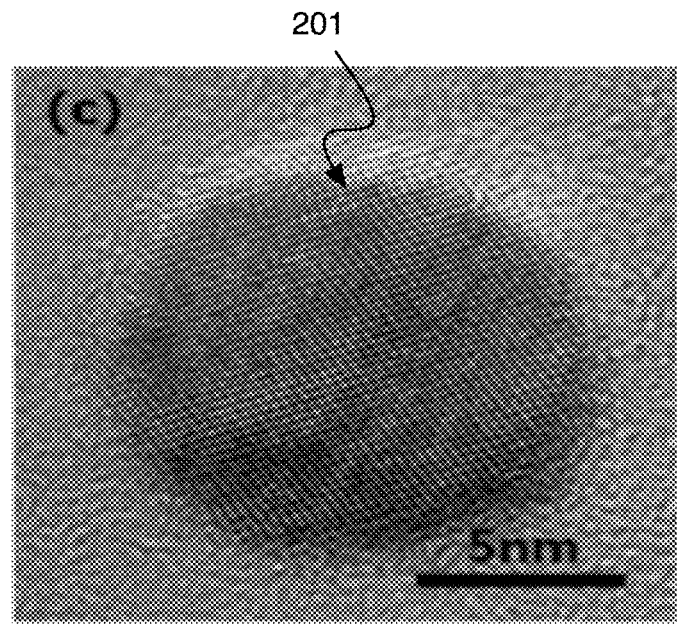
FIG. 2C is scanning electron micrograph (SEM) image of a silver nanocrystal, in accordance with some embodiments.
Figure 2D:
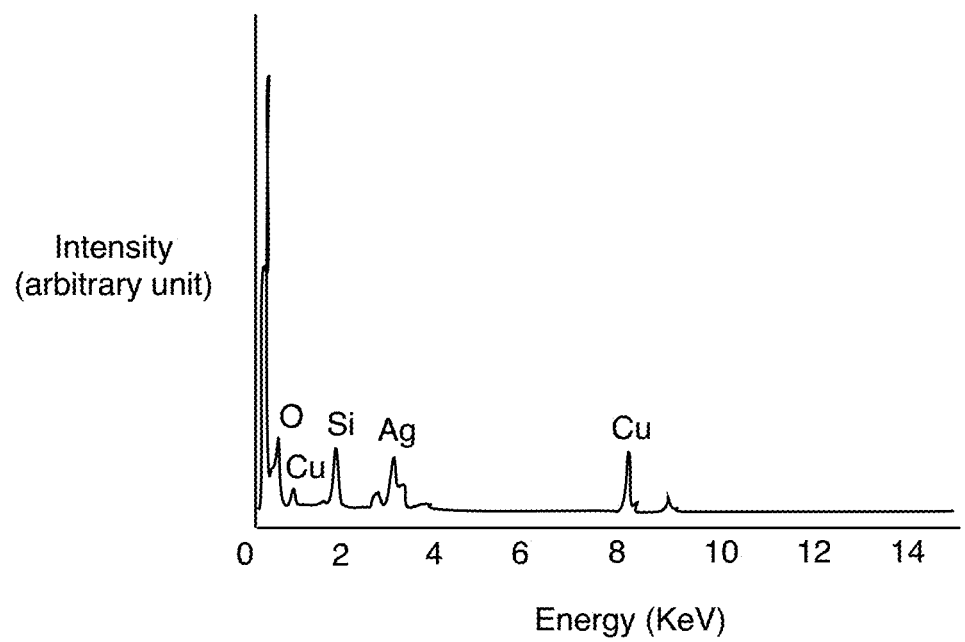
FIG. 2D is an energy-dispersive X-ray spectrum (EDS) of silver nanocrystals, in accordance with some embodiments.

FIGS. 2A, 2B, and 2C show TEM (FEI Titan operated at 300 kV) characterizations of silver nanocrystals 201, the building blocks for the silver feature formation, synthesized at room temperature. In FIG. 2A, the TEM image shows well-dispersed, spherical silver nanocrystals with a size ranged from 2 to 10 nm in diameter. In FIG. 2B, the SAED pattern indicates the high crystallinity of silver nanocrystals 201, showing clearly distinct ring patterns. The dominant diffraction patterns are indexed, which agrees well with typical silver nanocrystals. A silver nanocrystal 201 with approximately 10 nm in diameter was examined at high magnification and is shown in FIG. 2C. Lattice fringes are clearly observed, confirming the high crystallinity of silver nanocrystals. The EDS spectrum shown in FIG. 2D further illustrates the characteristics of silver nanocrystals 201, in accordance with some embodiments. Additional peaks aside from the silver peaks in the spectrum are thought to correspond to the TEM grid and EDS instrument.

Silver nanocrystals 201 characterized in FIG. 2A-2D were obtained at a flow rate of 0.4 mL min$^{-1}$, corresponding to a residence time of 118 seconds. This flow rate was selected based on the result of real time absorption spectrum in FIG. 1. At a flow rate of 0.4 mL the absorption peak with a high intensity is observed, indicating increased concentration of silver nanocrystals. Formation of conductive silver features may be prohibited at higher flow rates (e.g. 1.5 mL min$^{-1}$). At a flow rate below 0.4 mL min$^{-1}$ (e.g. 0.1 mL min$^{-1}$), silver nanocrystals 201 may experience aggregation within the microreactor, causing the non-uniform film formation. As such, the optimal flow rate (i.e. residence time) may be very important to achieve uniform and conductive silver films and features. Although not bound by theory, it is currently thought that at a flow rate of 0.4 mL min$^{-1}$, colloidal silver nanocrystals along with atomic silver and silver clusters are synthesized during silver feature deposition in accordance with some embodiments.

Figure 3A:
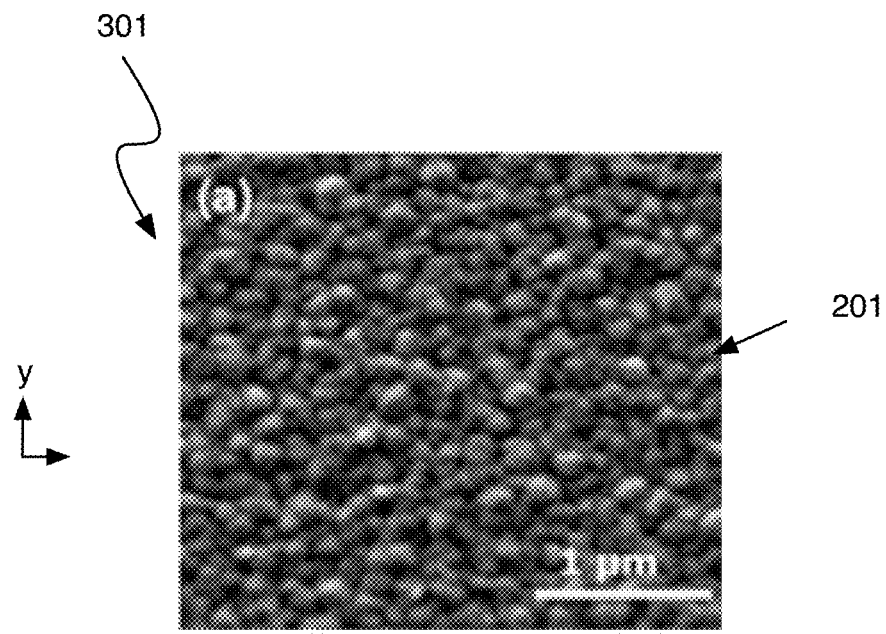
FIG. 3A is a top-down SEM image of a silver nanocrystalline film, in accordance with some embodiments.
Figure 3B:
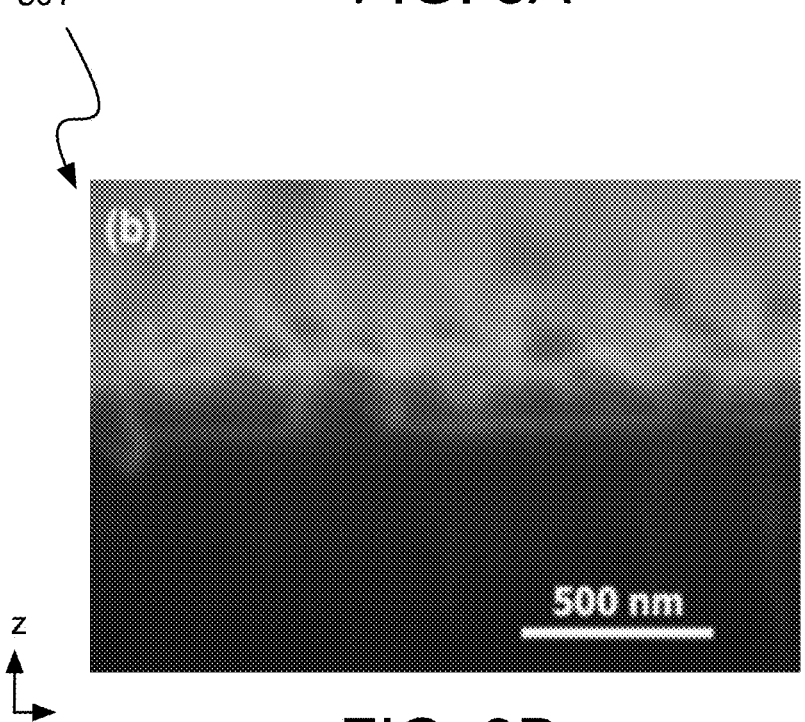
FIG. 3B is a cross-sectional SEM image of the silver nanocrystalline film depicted in FIG. 3A, in accordance with some embodiments.

FIG. 3A is a top-down SEM (Quanta 600 FEG) image of a silver nanocrystalline film 301, in accordance with some embodiments. FIG. 3B is a cross-sectional SEM image of silver nanocrystalline film 301, in accordance with some embodiments. FIGS. 3A and 3B depict silver film 301 obtained after a 15 minute deposition using silver nanoinks generated in-situ from a microreactor, in accordance with some embodiments. The deposition procedures are described elsewhere herein. Silver film 301 is composed of a number of spherical nanocrystals 201 (FIG. 3A). In this embodiment, the grain size of nanocrystals 201 varies from several tens of nanometers to several hundreds of nanometer in diameter. Nanocrystals 201 densely connect with one another without forming any voids, providing excellent electrical conductive paths. As shown in the cross-sectional SEM image of silver film 301 the thickness (e.g., z-dimension) of silver film 301 is uniform, and the average thickness is 134±9 nm. The highly dense silver nanocrystalline film 301 was further confirmed by AFM (Veeco, Inc.) analysis where the average roughness was measured to be 13.9 nm.

Figure 3C:
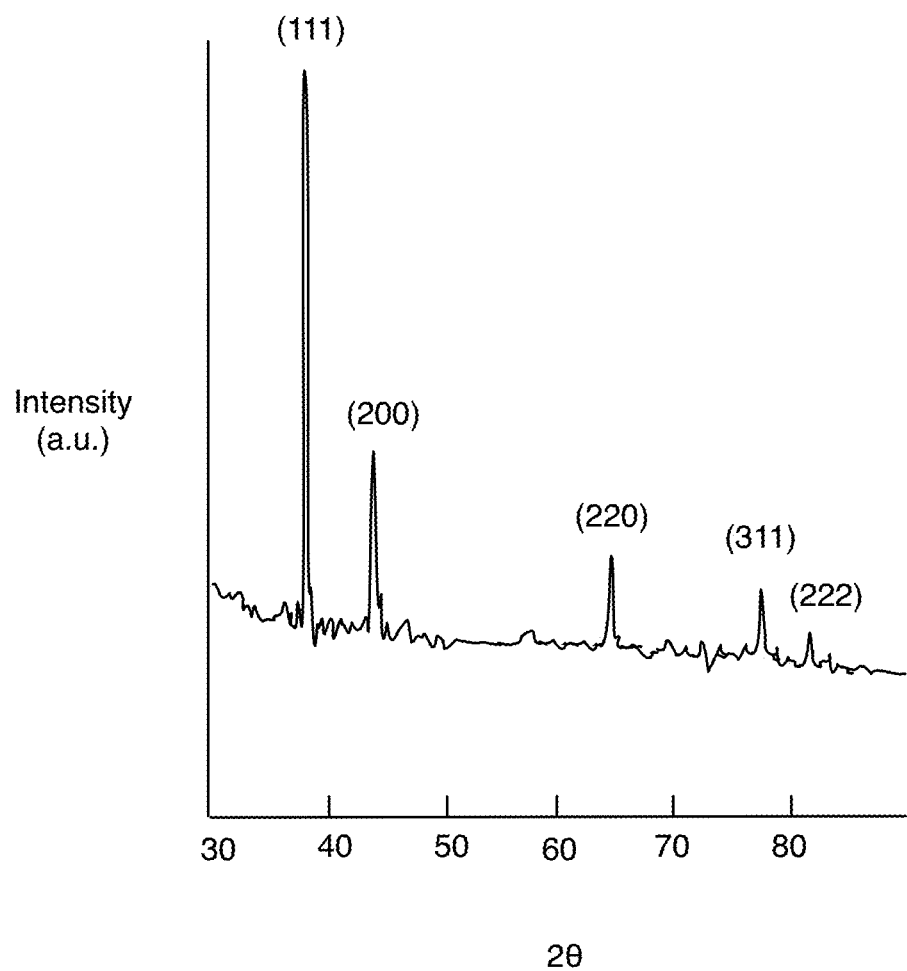
FIG. 3C is an x-ray diffraction pattern of a silver nanocrystalline film, in accordance with some embodiments.

FIG. 3C is an x-ray diffraction (XRD) pattern of silver nanocrystalline film 301, in accordance with some embodiments. XRD pattern was obtained by using a Rigaku Miniflex diffractometer with Cu Kα radiation and a graphite monochromator. The XRD pattern indicates high crystallinity of the film, exhibiting the sharp peaks with high intensity. The diffraction peaks are attributed to the face-centered cubic (fcc) crystalline structure of Ag. The XRD pattern in FIG. 3C is in accordance with the SAED pattern shown in FIG. 2B.

Figure 4A:
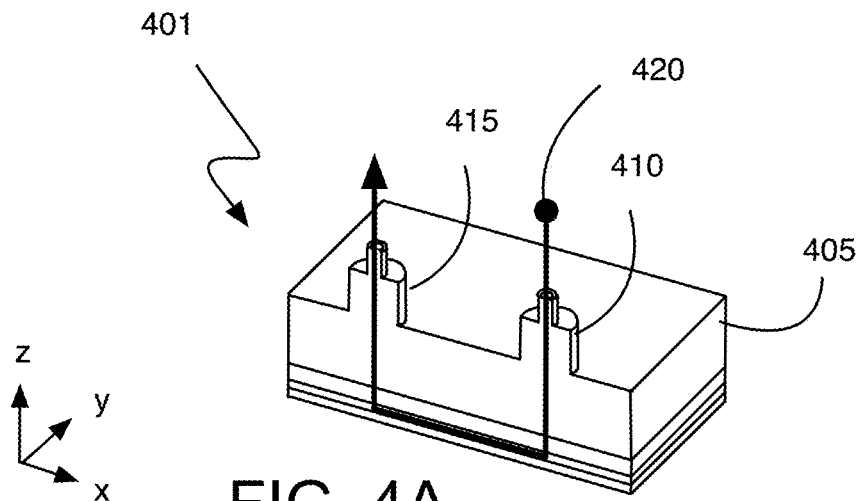
FIG. 4A is a sectional isometric view of a microchannel applicator, in accordance with some embodiments.
Figure 4B:
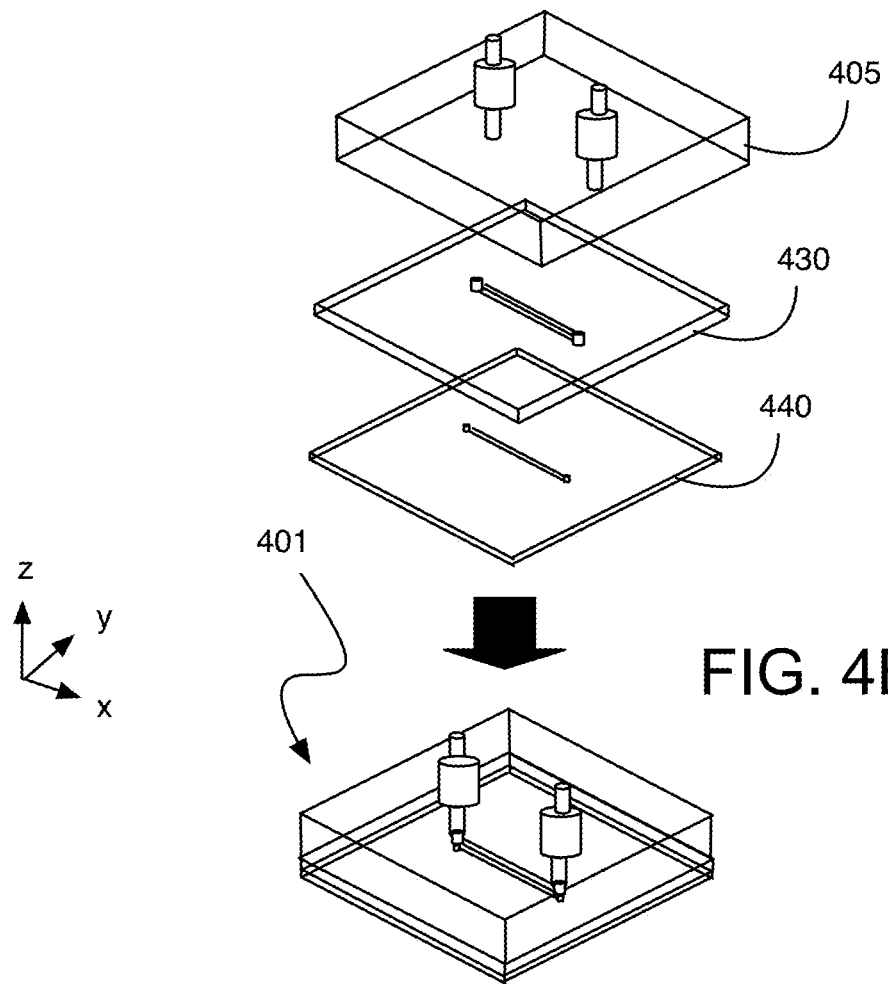
FIG. 4B is an isometric view illustrating assembly of a microchannel applicator, in accordance with some embodiments.

In some further embodiments, patterned silver features are fabricated with microreactor-assisted printing employing a microchannel applicator. Silver inks synthesized in a microreactor are guided to flow over the substrate to form the patterned silver feature features (e.g., lines, grids, etc.). FIG. 4A is a sectional isometric view of a microchannel applicator 401, in accordance with some embodiments. As illustrated, a microchannel is assembled with a flow cell 405 having an inlet 410 and outlet 415 for silver ink 420 flowed during silver deposition. FIG. 4B is an isometric view further illustrating assembly of microchannel applicator 401, in accordance with some embodiments. In the exemplary embodiments illustrated by FIG. 4B, microchannel applicator 401 includes a transparent flow cell 405, microchannel 430, and gasket 440.

Microchannel 430 may be fabricated by any know technique. In some embodiments, microchannel 430 is fabricated by hot embossing. The micro hot embossing technique is known as an effective replication approach to fabricate micro- and nanoscale features with high accuracy. Microchannel 430 may include any number of microscale lines 435 (e.g., from 1 to many thousands). The microchannel(s) may also define any patterned arrangement of lines, such as, but not limited to a 2D grid array of intersecting conduits or channels as further illustrated in FIG. 4C. Microchannel 430 may be of any suitable material (e.g., embossable), such as, but not limited to poly(methyl methacrylate) (PMMA), or polydimethylsiloxane (PMDS). For some embodiments, a hot embossing technique is employed to form a microchannel 430 of PMMA or PMDS. Such embossing processes may be divided into four operations: 1) heating, 2) embossing, 3) cooling, and 4) demolding. A mold feature with the silver line dimension is first fabricated, for example by any known photolithography technique. The mold is then used for the embossing operation. For example, a PMMA plate and mold may be heated to 147° C., followed by the embossing operation where the mold is imprinted into the heated PMMA plate. The force applied during the embossing operation may vary, but in some embodiments is approximately 500 N. After the embossing operation, the mold and the imprinted embosser may be cooled down (e.g., 90° C.). The embosser, having same dimension as the mold, is separated from the mold and may then be used for silver line patterning.

In some further embodiments, flow cell 405 is poly carbonate. For such embodiments, silver line formation may be visually observed throughout the deposition process. Gasket 440 is installed to prevent leaking of silver ink beyond the microchannel(s). Each component of microchannel applicator 401 is stacked in the order as shown in FIG. 4B. All components are advantageously tightly assembled, for example through the use of clamps. Silver ink 420, synthesized upstream of applicator 401 (e.g., in a microreactor as described further below), may continuously flow into inlet port 410 and flow a flow path over a substrate guided by microchannel 430. Such a deposition process may be continued for any duration as a function of the dimensions of microchannel 430. In some examples, deposition is performed for approximately 15 minutes to form a continuous conductive silver line.

FIG. 4C is a schematic diagram of a system 402 to manufacture a transparent conductive silver grid 495, in accordance with some embodiments. Grid 495 may be any 2D arrangement of intersecting metal lines deposited over the substrate surface. Each line in grid 495 may have the lateral dimensions and thicknesses described elsewhere herein for a metal trace. For example, the trace thicknesses may be may be sufficiently low (e.g., tens-hundreds of nanometers) that grid 495 is optically transmissive within a range of wavelengths (e.g., visible and/or near IR bands). Microchannel applicator 401 (FIG. 4B) is employed in system 402, but is not specifically illustrated for the sake of clarity. In the embodiment illustrated in FIG. 4C, a stream 451 of first reagent (e.g., Tollens' reagent) is supplied from vessel 452 to a first inlet of micromixer 460 under control of pump 453 (e.g., Ismatec, Inc. microprocessor controlled dispensing pump). Concurrently a stream 454 of second reagent (e.g., formaldehyde) is supplied from vessel 455 to a second inlet of micromixer 460 under control of pump 456. The mixed stream exits outlet of micromixer 460 and passes through a microreactor 465 providing the desired residence time for the process temperature (e.g., room temperature or approximately 25 C) to apply a sufficiently reacted conductive ink the grid features in microchannel 430 (e.g., assembled within microchannel applicator 401 depicted in FIG. 4B). As further illustrated in FIG. 4C, the embossed microchannel 430 (e.g., PMDS), once separated from a mold (not depicted) is mounted to substrate 480, for example with a gasket disposed there between (not depicted). In some embodiments, substrate 480 is a flexible polymeric substrate (e.g., polyimide), or a semiconductor material.

Figure 4D:
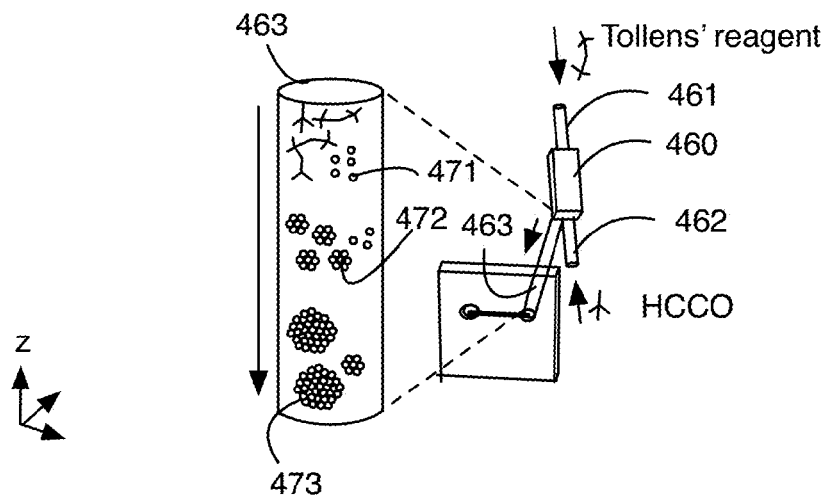
FIG. 4D is a schematic diagram of a micromixer component of a microchannel applicator, in accordance with some embodiments.

FIG. 4D is a schematic diagram further illustrating use of micromixer 460 for silver film deposition, in accordance with some embodiments where it is configured upstream of microchannel applicator 401. In some exemplary embodiments, micromixer 460 is a micro T-mixer commercially available from Upchurch scientific. Inlet tubing 461, 462 is Tygon tubing (e.g., 1.22 mm ID commercially available from Upchurch Scientific. Tollen's reagent is prepared by mixing 7 mM $AgNO_3$ solution with 0.19 M ammonia solution. Deionized water is used as the solvent. Silver nitrate ($AgNO_3$, commercially available from Alfa Aesar) and ammonium hydroxide (30 vol % $NH_4OH$, commercially available from Macron Chemicals) is used as received from the supplier without further purification. The $Ag(NH_3)_2^+$ solution is filtered by a filter paper (Whatman, Inc.). Formaldehyde (36 vol % HCHO, commercially available from Mallinckrodt Chemicals) is used as received without further purification. A 5 mL HCHO solution is diluted with 50 mL deionized water. Prepared $Ag(NH_3)_2^+$ solution and formaldehyde (10 vol %) are initially pumped into Tygon supply tubing 462. Micro-T-mixer 460 generates a homogeneously mixture of supplied reactants which is output to a linear reactor 463. In the exemplary room-temperature embodiment, linear reactor is a 40 cm long length of Tygon tubing to provide a volumetric flow rate of 0.4 mL min$^{-1}$ to an inlet of microchannel applicator 401. Within linear reactor 463, Tollen's reagent reacts with formaldehyde to form silver atoms 471. With additional reaction time within linear reactor 463, the silver atoms 471 form silver clusters 472. With additional reaction time within linear reactor 463, the silver clusters 472 form silver nanocrystals 473.

Figure 4E:
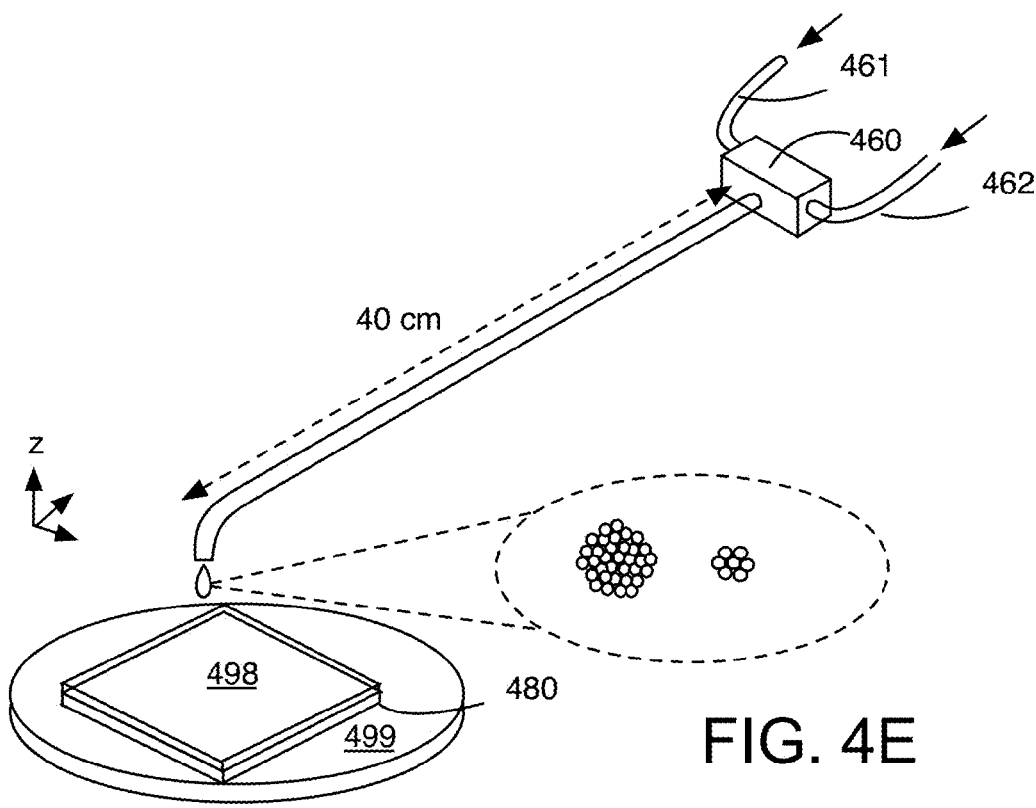
FIG. 4E is a schematic diagram further illustrating a microreactor and micromixer, in accordance with some embodiments.

In further embodiments, micromixer 460 may be so employed alone (e.g., without microchannel applicator 401) to form a silver film 498 rather than patterned lines. FIG. 4E illustrates one exemplary embodiment where micromixer 460 is configured substantially as described above in the context of FIG. 4D except effluent of linear reactor 463 is applied directly to substrate 480 (e.g., a soda lime glass substrate or a polymeric material). Substrate 480 may be disposed on a spin-coater 499 rotating at under 1500 rpm. Some substrates (such as glass) may be treated (e.g., with $O_2$ plasma) prior to the deposition process for cleaning and/or promoting wettability of the substrate surface.

Dimensions of silver line 495 fabricated according to FIG. 4A-4D may vary. In some of the exemplary embodiments employing the conditions described above in the context of FIG. 4A-4B, a silver line 2 cm in length and 300 μm in width was formed for characterization of the line properties. SEM images (not depicted) of the patterned silver feature show a well-defined line shape that consists of continuous, densely packed silver nanograins. The silver line is highly conductive, as is silver film 498 deposited by the spin-coating technique illustrated in FIG. 4E. The conductivity of the film, as obtained by using hall effect measurement with a Van der Pauw approach (Ecopia HMS-5000), is $3.3 \times 10^7$ (S/m) at room temperature. For this particular embodiment, conductivity is around half of the value of the bulk silver, and is one of the highest values among silver features prepared at room temperature demonstrated to date. It is worth noting that the silver feature(s) fabricated at room temperature in accordance with the exemplary embodiments herein is without any post-sintering steps. Of course, sintering may be further employed, if desired.

According to embodiments herein, a uniform and highly conductive silver film and feature may be fabricated at room temperature using reactive silver nanoinks generated from a continuous flow microreactor. In accordance with some exemplary embodiments, reactive silver nanobuilding blocks generated in-situ from the microreactor are directly delivered onto the substrates to form the silver films. Patterned silver features may be fabricated in further embodiments using a microreactor-assisted printing technique in which the reactive silver nanoinks are delivered to a surface via a microchannel applicator. An exemplary 300 μm wide silver line showed electrical conductivity values about half that of bulk silver, demonstrating the capability of a microreactor-assisted printing technique to fabricate highly conductive silver features at room temperature without the aid of a post-sintering process.

The above exemplary embodiments described in the context of silver conductive films and traces may be applied to other metals. More specifically, any metal that can be deposited by known electroless deposition processes may be well-suited to the deposition techniques described herein. While electroless deposition is typically practiced as a batch process (e.g., a form of chemical bath deposition, or CBD), similar chemistries may be adapted to implement a continuous fluid deposition method following the teachings herein.

Figure 5:
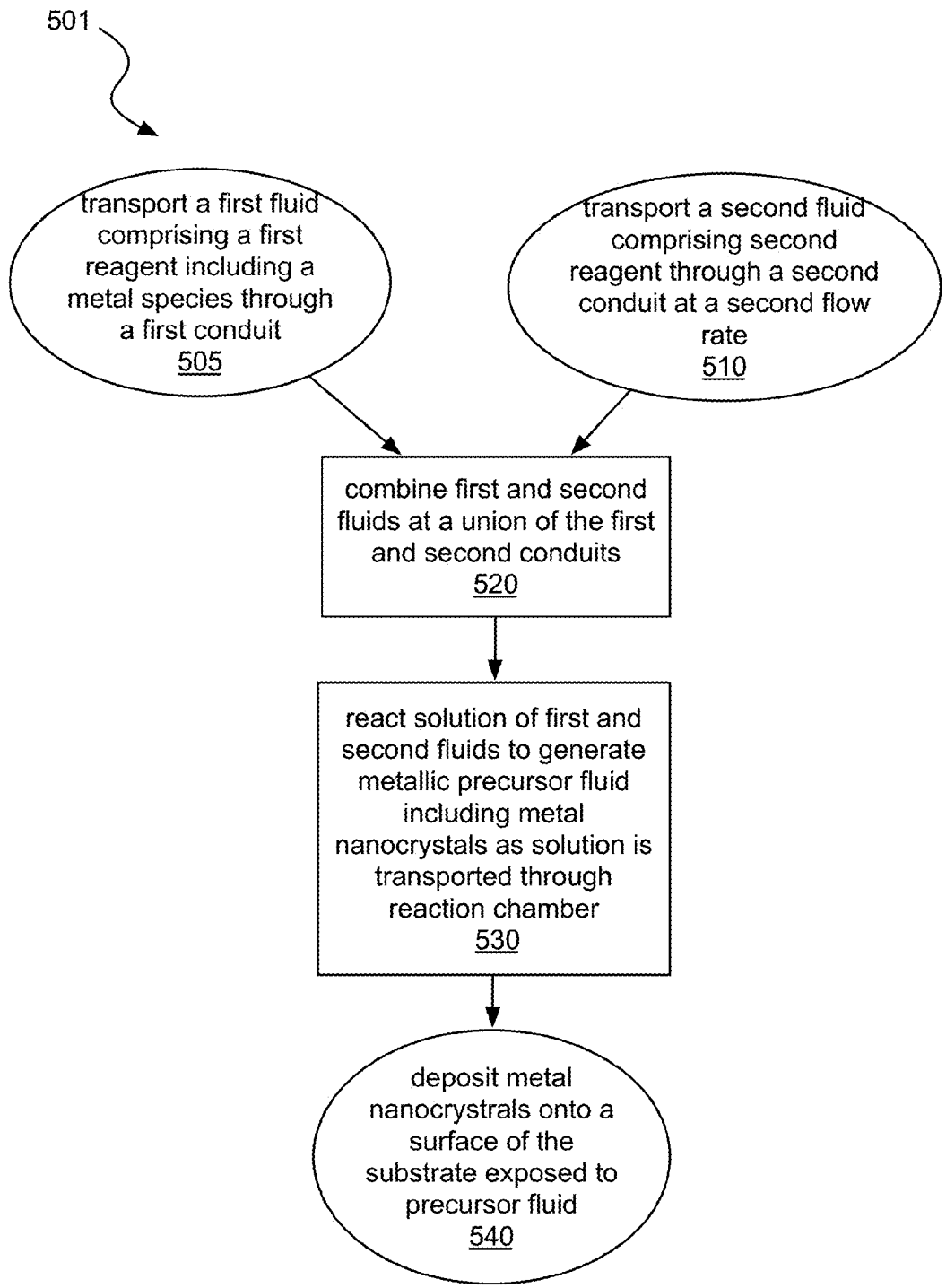
FIG. 5 is flow diagram illustrating a method for printing a conductive material as a non-selective film or selective trace on a substrate, in accordance with some embodiments.

FIG. 5 is flow diagram illustrating a method 501 for printing a conductive material as a non-selective film or selective trace on a substrate, in accordance with some embodiments. Method 501 may be performed by a fluidic system, such at those described in the context of FIGS. 4A-4E, above.

Method 501 begins with transporting two or more liquids (fluids), each carrying one or more reagent through separate conduits (operations 505, 510). In some embodiments, a first microprocessor-controlled dispensing pump coupled to the first conduit is to control the first liquid to a first predetermined flow rate. A second microprocessor-controlled dispensing pump coupled to the second conduit is to control the second liquid to a second predetermined flow rate.

At least one of the liquids transported at operations 505, 510 includes a metal species comprising one or more metal atom that is to be deposited onto a substrate surface. In the exemplary silver embodiment described in detail above, the metal species is metal compound soluble in a basic aqueous solution (e.g., $[Ag(NH_3)_2]^+$ complex). However, in some alternative embodiments, the metal species includes at least one of: Au, Cu, Co, Cr, Ni, Pt, Pd, Rh, CoNiP, CoWP, CoReP, CoMnP, CoNiZnP, CoB, CoFeB, NiFeP, NiMoP, NiWP, or NiZnP. As for the exemplary silver embodiments, the first liquid may be aqueous. In alternative embodiments however, the first liquid is non-aqueous.

In embodiments, at least a second of the liquids transported at operations 505, 510 comprises a regent reactive with the metal species. In some embodiments, the reagent reacts with the metal species to form metal nanocrystals in solution. In some embodiments, the second liquid includes a reductant of the metal species present in the first fluid. In the exemplary silver embodiment described in detail above, the reductant is HCHO. As for the exemplary HCHO embodiments, the second liquid may be aqueous. In alternative embodiments however, the second liquid is non-aqueous.

At operation 520, the first and second liquids are combined to form metal nanocrystals in-situ as the reactive solution is transported toward a substrate surface. Any number of liquids may be combined at operation 520, for example at a manifold uniting any number of inlet liquid conduits. At the union, or downstream thereof, one or more micromixer such as, but not limited to, an interdigital T-mixer, may be employed to mix the input liquids. As the combined solution is transported downstream of the union, the liquids react to generate a metallic precursor liquid. Within a fluidic system configured to perform method 501, conduit downstream of the first and second conduit union may be considered a portion of a continuous flow reaction chamber.

At operation 530, metallic precursor liquid including metal nanocrystals is generated by reaction of the reagents in the solution as the solution flows through the reactor. In some embodiments, kinetic control of the reaction forming metal nanocrystals is primarily through control of the first and second liquid flow rate. For example, a sum of the first flow rate and the second flow rate may provide a predetermined residence time within a reaction chamber having a predetermined dimension (e.g., length and cross-sectional area). In some further embodiments, the first flow rate may be controlled relative to the second flow rate to control the composition of the solution comprising the first and second liquids within the reaction chamber. In some embodiments, flow rates of one or more of the first and second liquids are continuously controlled to a set point, for example following any PID control algorithm. In some alternative embodiments, flow rates of one or more of the first and second liquids are pulsed, for example following any pulse code modulation algorithm to vary a duty cycle associated with one or more flow rate.

In some embodiments, kinetic control of the reaction of the first and second reagents is further through liquid and/or reaction chamber temperature control. As such, one or more portions of the fluidic system performing the method 501 may be temperature-controlled (e.g., with one or more conduit submerged in a water bath, etc.). In some embodiments, method 501 is performed at a low temperature (e.g., less than 40° C. and ideally at or near room temperature). Low (ambient) temperature embodiments may advantageously simplify the fluidic system and/or control of reaction kinetics. Low temperature operation may also enable printing of conductive traces upon substrates having relatively low glass transition temperatures (e.g., ~150° C. for a polycarbonate substrate). In the exemplary embodiments described above, the in-situ formation of silver nanocrystals is performed at room temperature (e.g., 25° C.). Although there are clear advantages to room temperature embodiments, it is recognized that a higher reaction rate may be achieved at higher temperatures. In some embodiments therefore, the reaction chamber and/or substrate are maintained at a temperature above ambient, but below the glass transition temperature of a substrate. In some exemplary embodiments, reaction of the first and second regents may be performed at 50-90° C., or higher.

In some embodiments, kinetic control of the reaction of the first and second reagents is further through control of one or more external activation energy sources, such as, but not limited to UV light sources, microwave sources, photochemical sources, plasma sources, ultrasonic sources, or a combination thereof.

At operation 540, metal nanocrystals present in the precursor liquid are deposited onto a substrate surface exposed to the precursor liquid. In some embodiments, as described above, metal nanocrystals may be deposited non-selectively over an entire substrate surface to form a conductive thin film, for example by dispensing the precursor liquid over an entire substrate surface. In some alternative embodiments, as also exemplified above, metal nanocrystals are selectively deposited to additively fabricate a conductive trace over a substrate surface. Metal trace embodiments may be advantageous wherever subtractive trace fabrication is impractical, for example where lithographic masking and/or subtractive etching processes are prohibitively expensive.

In some embodiments, printing of a metal trace proceeds with a microchannel applicator, for example substantially as described above where depositing the metal nanocrystals further comprises transporting the metallic precursor fluid through a third conduit disposed within the applicator that defines the substrate surface over which the trace is to be disposed. In some embodiments, the third conduit comprises a microchannel having a width less than 100 μm defined by an embosser face and an opposing substrate surface. The microchannel may also have any desired depth to ensure a suitable pressure drop for the precursor liquid and/or to enable fabrication of a conductive trace of arbitrary predetermined thickness. While many printing techniques that rely post-deposition thermal processing (i.e. anneal/sintering) cannot achieve conductive film thickness beyond a few hundred nanometers, method 501 may be employed to print conductive traces with a thickness, as measured from the substrate surface, of a 1 μm, or more, merely as a function of deposition time. Microchannel width may be varied with microchannel depth to maintain any suitable flow rate of the precursor liquid. For example, the microchannel lateral width may be less than 10 μm, and where the microchannel depth is proportionally increased (e.g., 30× that employed in exemplary embodiment described above for a 300 μm microchannel), the liquid flow rates and residence times described above for a 300 μm microchannel remain applicable.

For metal trace printing embodiments, method 501 may further comprise separating the molding plate face from the substrate surface after depositing the metal nanocrystals. The metal trace is then substantially complete, end method 501 without need for any post-deposition thermal processing.

Although not bound to theory, it is currently believed that metal nanocrystal deposition occurring at operation 540 proceeds with nucleation of the substrate surface followed by subsequent nanocrystal deposition and growth. The deposition mechanism is distinct from simple precipitation with a surface reaction improving the conductivity of the deposited film beyond that of a mere precipitate.

In some embodiments, a metallized product comprises a metal film or trace that is carbon-free. In contrast to metallization resulting from a deposition and sintering process, which retains some carbon content indicative of a carbonaceous carrier media in the final metallization, no trace carbon is present in the silver trace described in detail above. In some further embodiments, the carbon-free silver trace comprises silver nanocrystals having an average diameter less than 10 nm. In contrast, nanoparticles typical of processes entailing a post-deposition sintering process are considerably larger (e.g., 10-20 nm, or more). As further noted above, for a silver trace having a current carrying cross-sectional area of no more than 50 μm², conductivity is at least $3 \times 10^7$ S/m. This high conductivity is indicative of a trace having silver crystalline nanoparticles of highly uniform size. Low average surface roughness (e.g., <14 nm) for the exemplary silver film having a thickness just under 150 nm is also indicative of highly uniform nanoparticle size. Strong crystal texture (e.g., fcc for the silver embodiments described above) is also found in the metallization fabricated following the methods described herein.

These metal trace properties and the ability to fabricate such a metal trace at room temperature may be advantageous for metallization on low temperature substrates. In some embodiments, a metallized product comprises film or trace metallization disposed over a substrate having a glass transition temperature below 150° C., such as, but not limited to, a polycarbonate substrate.

Figure 6:
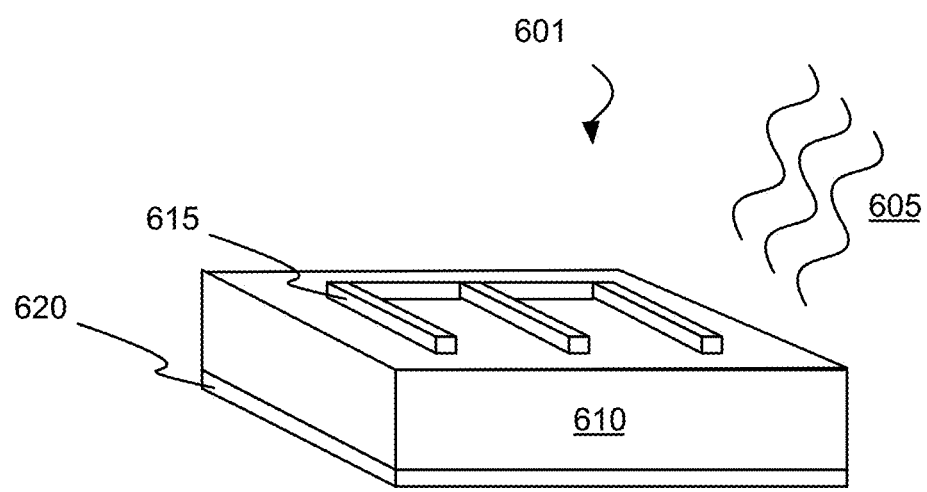
FIG. 6 is an isometric sectional view of a photovoltaic cell including metal traces printed with in-situ reactive inks, in accordance with some embodiments.

In some embodiments, a metallization product comprises a photovoltaic cell including metal traces printed with in-situ reactive inks. In FIG. 6, a photovoltaic cell 601 includes a semiconductor 610 to generate a DC current between a frontside electrode 615 and backside electrode 620 in the presence of solar energy 605. Metallization on at least one surface of semiconductor 610 comprises frontside electrode trace 615 of limited lateral dimension to maximize solar conversional efficiency of cell 601. In an exemplary embodiment, trace 615 has a lateral dimension less than 50 μm, and advantageously less than 10 μm (e.g., 1 μm). To maintain acceptable IR drop, trace 615 has a vertical dimension (i.e. trace thickness) of more than 1 μm, and advantageously more than 10 μm. In some embodiments, a microchannel applicator is embossed to have microchannels dimensioned to fabricate trace 615 following the techniques described in detail above. Such dimensions are not currently possible with trace printing techniques reliant on post-processing, and would otherwise require expensive subtractive processing. In some further embodiments, trace 615 is carbon-free and comprises nanocrystals having an average diameter less than 10 nm. In some exemplary embodiments, trace 615 comprises carbon-free nanocrystalline silver having nanoparticle diameters between 2 nm and 10 nm.

As exemplified above, in some embodiments a continuous flow conductive trace printing apparatus comprises a first liquid conduit coupled to a first liquid supply through a microprocessor-controlled flow controller. In some embodiments, the continuous flow conductive trace printing apparatus further comprises a second liquid conduit coupled to a second liquid supply through a microprocessor-controlled flow controller. In some embodiments, the continuous flow conductive trace printing apparatus further comprises a micromixer in fluid communication with an outlet of the first and second liquid conduits. In some embodiments, the continuous flow conductive trace printing apparatus further comprises a reaction chamber in fluid communication with an outlet of the micromixer. In some embodiments, the reaction chamber has dimensions sufficient to form metal nanocrystals through reaction of a mixture of first and second liquids. In some embodiments, the continuous flow conductive trace printing apparatus further comprises a microchannel applicator further comprising at least one microchannel in fluid communication with an outlet of the reaction chamber. The microchannel is to expose at least one surface of a substrate to metal nanocrystals formed within the reaction chamber. In some embodiments, the microchannel is disposed within a molding plate opposite a surface of the substrate, the microchannel and the opposing substrate surface forming a third conduit in fluid communication with the reaction chamber. In some embodiments suitable for aqueous metallic precursor liquids, the microchannel has a hydrophobic surface and the substrate surface has a hydrophilic surface. In some embodiments, the microchannel is disposed within a surface of the substrate opposite a face of a molding plate.

While certain features set forth herein have been described with reference to embodiments, this description is not intended to be construed in a limiting sense. Hence, various modifications of the implementations described herein, as well as other implementations, which are apparent to persons skilled in the art to which the present disclosure pertains are deemed to be within the spirit and scope of the present disclosure.

It will be recognized that the embodiments are not limited to the exemplary embodiments so described, but can be practiced with modification and alteration without departing from the scope of the appended claims. For example, the above embodiments may include specific combination of features. However, the above embodiments are not limited in this regard and, in embodiments, the above embodiments may include undertaking only a subset of such features, undertaking a different order of such features, undertaking a different combination of such features, and/or undertaking additional features than those features explicitly listed.

What is claimed is:

1. A method of printing a conductive trace on a substrate, the method comprising:
    forming a first conduit between a surface of a substrate and a material layer disposed over the substrate surface, at least one of the material layer or the substrate including a channel of a predetermined trace pattern;
    transporting a first liquid comprising a first reagent through a second conduit;
    transporting a second liquid comprising second reagent through a third conduit, wherein one or more of the first and second liquids comprise a metal species;
    generating a metallic precursor liquid comprising metal nanocrystals by reacting a solution of the first and second liquids as the solution is transported from a union of the second and third conduits through a reaction chamber toward the first conduit; and depositing the metal nanocrystals onto a portion of the substrate surface corresponding to the trace pattern by transporting the metallic precursor liquid through the first conduit.

2. The method of claim 1, wherein:
the first conduit comprises a microchannel having a lateral width less than 100 μm defined in a molding plate face that is mated to the substrate surface; and
the method further comprises separating the molding plate face from the substrate surface after depositing the metal nanocrystals onto the portion of the substrate surface exposed to the metallic precursor liquid along a length of the microchannel.

3. The method of claim 1, wherein the metal species comprises at least one of Ag, Au, Cu, Co, Cr, Ni, Pt, Pd, Rh, CoNiP, CoWP, CoReP, CoMnP, CoNiZnP, CoB, CoFeB, NiFeP, NiMoP, NiWP, or NiZnP.

4. The method of claim 1, wherein:
the first reagent comprises a metal compound soluble in a basic aqueous solution; and
the second reagent comprises a reductant of the metal species.

5. The method of claim 4, wherein:
the first reagent comprises silver nitrate (AgNO3);
the first liquid comprises aqueous ammonium hydroxide and $[Ag(NH_3)_2]^+$ complexes;
the second reagent comprises formaldehyde (HCHO); and
the second liquid comprises aqueous HCHO.

6. The method of claim 1, further comprising:
controlling a sum of a first flow rate of the first liquid through the second conduit and a second flow rate of the second liquid through the third conduit to provide a predetermined residence time within the reaction chamber; and
controlling the first flow rate relative to the second flow rate to control the composition of the solution of the first and second liquids within the reaction chamber.

7. The method of claim 6, wherein the reaction of the first and second liquids occurs at no more than 40° C.

8. A method of printing a conductive trace on a substrate, the method comprising:

transporting a first liquid comprising a first reagent through a first conduit;

transporting a second liquid comprising second reagent through a second conduit, wherein one or more of the first and second liquids comprise a metal species;

generating a metallic precursor liquid comprising metal nanocrystals by reacting a solution of the first and second liquids as the solution is transported from a union of the first and second conduits through a reaction chamber toward a surface of a substrate; and depositing the metal nanocrystals onto the surface of the substrate by transporting the metallic precursor liquid through a third conduit defining the surface of the substrate over which the conductive trace is to be disposed, wherein:
the first reagent comprises silver nitrate (AgNO3);
the first liquid comprises aqueous ammonium hydroxide and $[Ag(NH_3)_2]^+$ complexes;
the second reagent comprises formaldehyde (HCHO); and
the second liquid comprises aqueous HCHO.

9. The method of claim 8, wherein:
the third conduit comprises a microchannel having a lateral width less than 100 μm defined in a molding plate face that is mated to the substrate surface; and
the method further comprises separating the molding plate face from the substrate surface after depositing the metal nanocrystals onto the portion of the substrate surface exposed to the metallic precursor liquid along a length of the microchannel.

10. The method of claim 8, further comprising:
controlling a sum of a first flow rate of the first liquid through the first conduit and a second flow rate of the second liquid through the second conduit to provide a predetermined residence time within the reaction chamber; and
controlling the first flow rate relative to the second flow rate to control the composition of the solution of the first and second liquids within the reaction chamber.

11. The method of claim 8, wherein the reaction of the first and second liquids occurs at no more than 40° C.

* * * * *